(12) United States Patent
Ando et al.

(10) Patent No.: US 8,895,434 B2
(45) Date of Patent: Nov. 25, 2014

(54) REPLACEMENT METAL GATE STRUCTURE FOR CMOS DEVICE

(71) Applicants: International Business Machines Corporation, Armonk, NY (US); Global Foundries Inc, Grand Cayman (KY)

(72) Inventors: Takashi Ando, Tuckahoe, NY (US); Kisik Choi, Hopewell Junction, NY (US); Vijay Narayanan, New York, NY (US)

(73) Assignees: International Business Machines Corporation, Armonk, NY (US); Global Foundries Inc, Grand Cayman (KY)

( * ) Notice: Subject to any disclaimer, the term of this patent is extended or adjusted under 35 U.S.C. 154(b) by 0 days.

(21) Appl. No.: 13/676,575

(22) Filed: Nov. 14, 2012

(65) Prior Publication Data

US 2014/0131809 A1    May 15, 2014

(51) Int. Cl.
*H01L 21/44*    (2006.01)
*H01L 21/02*    (2006.01)
*H01L 21/8238*  (2006.01)

(52) U.S. Cl.
CPC .. *H01L 21/02697* (2013.01); *H01L 21/823842* (2013.01); *H01L 21/823857* (2013.01)
USPC ............ 438/656; 438/652; 257/E21.584

(58) Field of Classification Search
USPC ................. 438/652, 653, 654, 656
See application file for complete search history.

(56) References Cited

U.S. PATENT DOCUMENTS

| 7,045,406 | B2 | 5/2006 | Huotari et al. | |
|---|---|---|---|---|
| 7,473,637 | B2 | 1/2009 | Kraus et al. | |
| 7,807,525 | B2 | 10/2010 | Doris et al. | |
| 2005/0272191 | A1* | 12/2005 | Shah et al. | 438/197 |
| 2007/0272967 | A1 | 11/2007 | Pantisano et al. | |
| 2008/0105920 | A1 | 5/2008 | Hirano et al. | |
| 2009/0218693 | A1* | 9/2009 | Lee et al. | 257/751 |
| 2010/0151676 | A1* | 6/2010 | Ritchie et al. | 438/660 |
| 2011/0198699 | A1* | 8/2011 | Hung et al. | 257/369 |
| 2012/0028434 | A1* | 2/2012 | Lee et al. | 438/400 |

OTHER PUBLICATIONS

B. H. Lee et al., "Gate stack technology for nanoscale devices," Materials Today, vol. 9, Issue 6, Jun. 2006, pp. 32-40.

(Continued)

*Primary Examiner* — Reema Patel
(74) *Attorney, Agent, or Firm* — Law Offices of Ira D. Blecker, P.C.

(57) ABSTRACT

A method of fabricating a replacement metal gate structure for a CMOS device including forming a dummy gate structure on an nFET portion and a pFET portion of the CMOS device; depositing an interlayer dielectric between the dummy gate structures; removing the dummy gate structures from the nFET and pFET portions, resulting in a recess on the nFET portion and a recess on the pFET portion; conformally depositing a gate dielectric into the recesses on the nFET and pFET portions; depositing sequential layers of a first titanium nitride, tantalum nitride and a second titanium nitride into the recesses on the nFET and pFET portions; removing the second layer of titanium nitride from the nFET portion only; depositing a third layer of titanium nitride into the recesses on the nFET and pFET portions; and filling the remainder of the cavity on the nFET and pFET portions with a metal.

16 Claims, 6 Drawing Sheets

(56) References Cited

OTHER PUBLICATIONS

C. L. Hinkle et al., "Interfacial oxygen and nitrogen induced dipole formation and vacancy passivation for increased effective work functions in TiN/HfO2 gate stacks," Applied Physics Letters, vol. 96, Issue 10, Mar. 2010, 103502, 3 pages.

K. Tai et al., "High Performance pMOSFET with ALD-TiN/HfO2 Gate Stack on (110) Substrate by Low Temperature Process," Proceeding of the 36th European Solid-State Device Research Conference, ESSDERC 2006. Sep. 19-21, 2006, pp. 121-124.

C. F. Burham, "Development of an innovative fabrication method for n-MOS to p-MOS tunable single metal gate/high-k insulator devices for multiple threshold voltage," Ph.D. Thesis, The University of Texas at Austin, Dec. 2009. 109 pages.

K. Choi et al., "The effect of metal thickness, overlayer and high-k surface treatment on the effective work function of metal electrode," Proceedings of 35th European Solid-State Device Research Conference, ESSDERC 2005, Sep. 12-16, 2005, pp. 101-104.

\* cited by examiner

REPLACEMENT METAL GATE STRUCTURE FOR CMOS DEVICE

RELATED APPLICATION

This application is related to U.S. patent application Ser. No. 13/676,575, entitled "REPLACEMENT METAL GATE STRUCTURE FOR CMOS DEVICE", filed even date herewith.

BACKGROUND

The exemplary embodiments relate to a manufacturing process for replacement metal gate CMOS devices and, more particularly, relate to a simpler manufacturing process to obtain quarter-gap pFET.

Today's integrated circuits include a vast number of devices. Smaller devices and shrinking ground rules are the key to enhance performance and to reduce cost. As FET (Field Effect Transistor) devices are being scaled down, the technology becomes more complex, and changes in device structures and new fabrication methods are needed to maintain the expected performance enhancement from one generation of devices to the next.

Device performance may be enhanced by the use of metal gates and high-k dielectric materials.

BRIEF SUMMARY

The various advantages and purposes of the exemplary embodiments as described above and hereafter are achieved by providing, according to a first aspect of the exemplary embodiments, a method of fabricating a replacement metal gate structure for a CMOS device on a semiconductor substrate. The method comprising: forming a dummy gate structure on an nFET portion of the CMOS device and on a pFET portion of the CMOS device, each of the dummy gate structures comprising a layer of oxide, a layer of polysilicon or amorphous silicon and a nitride hard mask; forming spacers on the dummy gate structures; depositing an interlayer dielectric between the dummy gate structures; removing the dummy gate structures from the nFET portion and the pFET portion, resulting in a recess bounded by the spacers on the nFET portion and a recess bounded by the spacers on the pFET portion; conformally depositing a gate dielectric into the recesses on the nFET portion and pFET portion; depositing sequential layers of a first titanium nitride, tantalum nitride and a second titanium nitride into the recesses on the nFET portion and pFET portion; removing the second layer of titanium nitride from the nFET portion only; depositing a third layer of titanium nitride into the recesses on the nFET portion and pFET portion; depositing titanium aluminum onto the third layer of titanium nitride in the recesses on the nFET portion and pFET portion; and filling the remainder of the cavity on the nFET portion and pFET portion with a metal different from titanium aluminum.

According to a second aspect of the exemplary embodiments, there is provided a method of fabricating a replacement metal gate structure for a CMOS device on a semiconductor substrate. The method comprising: forming a dummy gate structure on an nFET portion of the CMOS device and on a pFET portion of the CMOS device; depositing an interlayer dielectric between the dummy gate structures; removing the dummy gate structures from the nFET portion and the pFET portion, resulting in a recess on the nFET portion and a recess on the pFET portion; depositing a gate dielectric into the recesses on the nFET portion and pFET portion; depositing sequential layers of a first titanium nitride, tantalum nitride and a second titanium nitride into the recesses on the nFET portion and pFET portion, the first layer of titanium nitride being in contact with the gate dielectric; removing the second layer of titanium nitride from the nFET portion only; depositing a third layer of titanium nitride into the recesses on the nFET portion and pFET portion, the third layer of titanium nitride being in contact with the tantalum nitride on the nFET portion and in contact with the second layer of titanium nitride on the pFET portion; depositing titanium aluminum onto the third layer of titanium nitride in the recesses on the nFET portion and pFET portion; and filling the remainder of the cavity on the nFET portion and pFET portion with a metal.

According to a third aspect of the exemplary embodiments, there is provided a CMOS device comprising: a semiconductor substrate having an nFET portion, a pFET portion and an interlayer dielectric between the nFET portion and pFET portion; the nFET portion having a gate structure, the gate structure comprising a recess filled with a conformal high-k dielectric on a bottom and a side of the recess, a first titanium nitride layer on the high-k dielectric, a barrier layer on the first titanium nitride layer, a second titanium nitride layer on the barrier layer and a gate metal filling the remainder of the recess; and the pFET portion having a gate structure, the gate structure comprising a recess filled with a conformal high-k dielectric on a bottom and a side of the recess, a first titanium nitride layer on the high-k dielectric, a barrier layer on the first titanium nitride layer, a second titanium nitride layer on the barrier layer, a third titanium nitride layer on the second titanium nitride layer and a gate metal filling the remainder of the recess.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1 to 11 illustrate a method of the exemplary embodiments of forming a CMOS structure wherein:

DETAILED DESCRIPTION

Typically, small FET devices with high-k dielectrics and metal gates require expensive complicated processing. It would be useful to find ways to simplify the fabrication process, while maintaining most of the performance benefits offered by such advanced structures. In addition, reduction of gate leakage current and improvement in thermal stability of nFET devices.

Referring to the Figures in more detail, and particularly referring to FIGS. 1 to 11, there is disclosed one or more methods for fabricating CMOS devices according to the exemplary embodiments.

Figure 1:
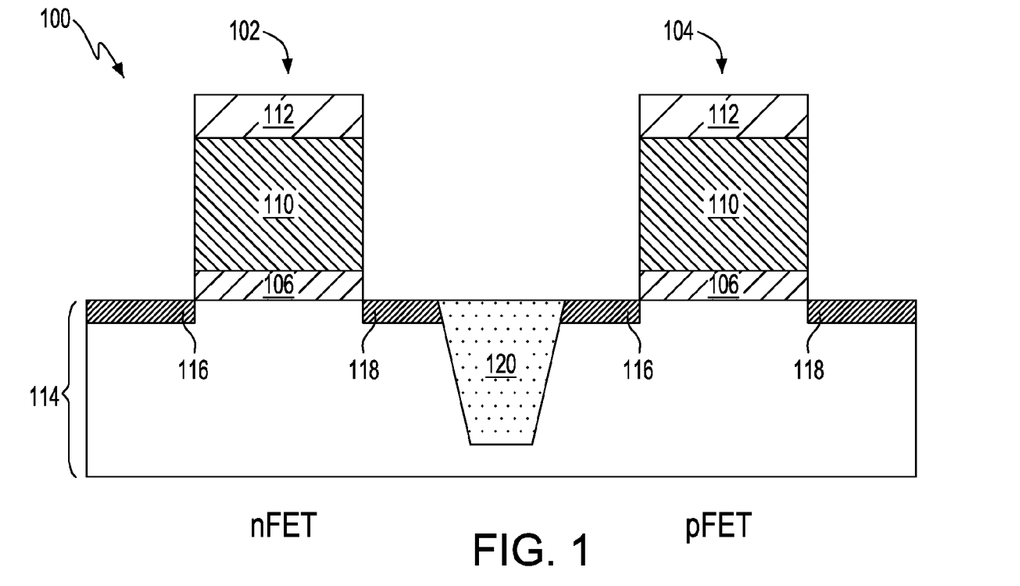
FIG. 1 illustrates dummy gate structures on nFET and pFET portions of a semiconductor substrate.

In FIG. 1, gate stack structures are formed which become dummy gate structures in a replacement gate process of the exemplary embodiments. Blanket layers of an oxide, polysilicon (could also be amorphous silicon), and a nitride hard mask are deposited on a semiconductor substrate.

For purposes of illustration and not limitation, the oxide may be silicon oxynitride and conventionally deposited to a thickness of about 1 to 4 nanometers (nm). The polysilicon may be conventionally deposited to a thickness of about 100 nm. The nitride hard mask, such as silicon nitride, may be conventionally deposited to a thickness of about 50 nm.

The various layers of oxide, polysilicon and nitride hard mask may be conventionally patterned by a reactive ion etching (RIE) process resulting in a semiconductor structure 100 including a gate structure 102 on an nFET portion of the semiconductor structure 100 and a gate structure 104 on a pFET portion of the semiconductor structure 100. Each of the gate structures 102, 104 includes an oxide layer 106, a polysilicon layer 110 and a hard mask layer 112.

The semiconductor structure 100 further includes a semiconductor substrate 114 which may be a bulk semiconductor material or may be a semiconductor on insulator (SOI). The semiconductor material making up the semiconductor substrate may be a silicon material or any other semiconductor material.

Each of the gate structures 102, 104 may further include a source 116 and a drain 118 adjacent to the gate structures 102, 104 as is known in the art. Separating the nFET portion from the pFET portion may be an isolation region 120.

Figure 2:
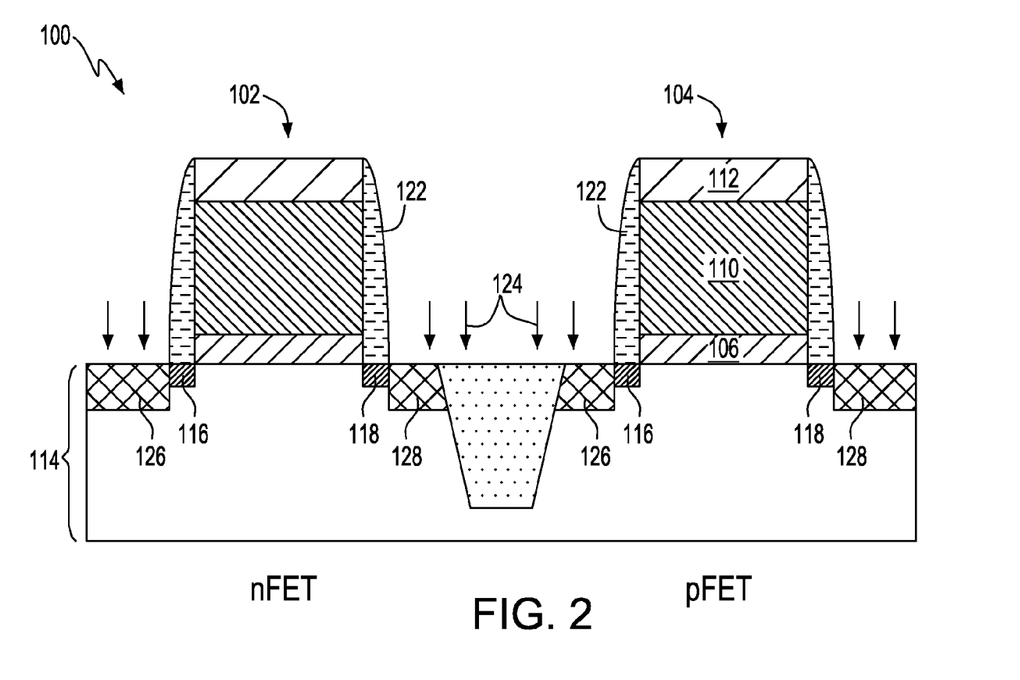
FIG. 2 illustrates forming spacers on the dummy gate structures.

Referring now to FIG. 2, oxide or nitride spacers 122 have been conventionally formed on the nFET gate structure 102 and the pFET gate structure 104. Portions 126 of sources 116 not blocked by spacers 122 and portions 128 of drains 118 not blocked by spacers 122 may be ion implanted 124 followed by a dopant activation anneal.

Figure 3:
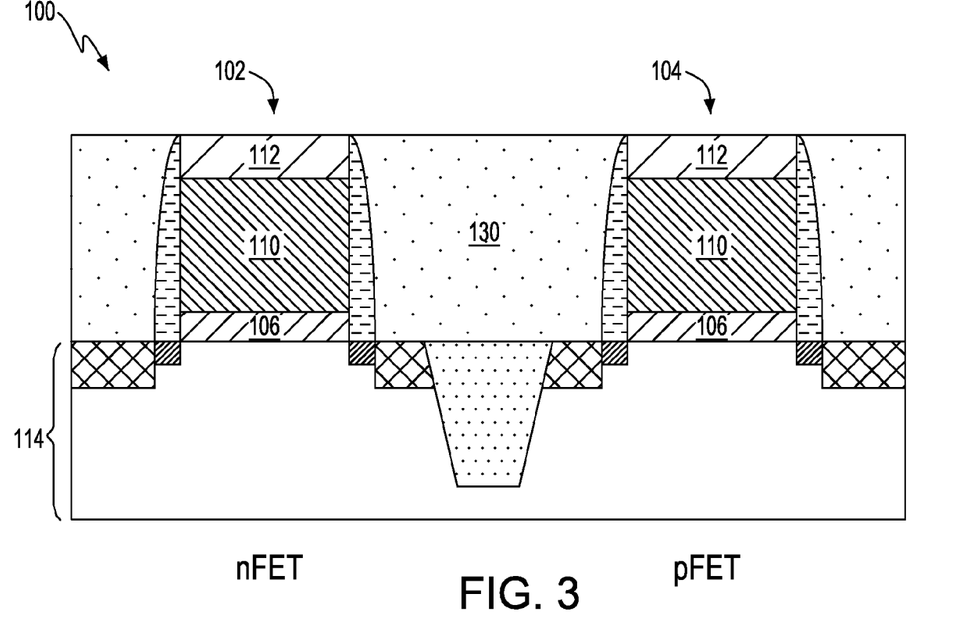
FIG. 3 illustrates forming an interlayer dielectric layer.

An interlayer dielectric (ILD) 130 may be deposited and planarized, stopping on the nitride hard mask 112 of the gate structures 102, 104 as shown in FIG. 3. The ILD may be any conventional ILD such as an oxide.

Figure 4:
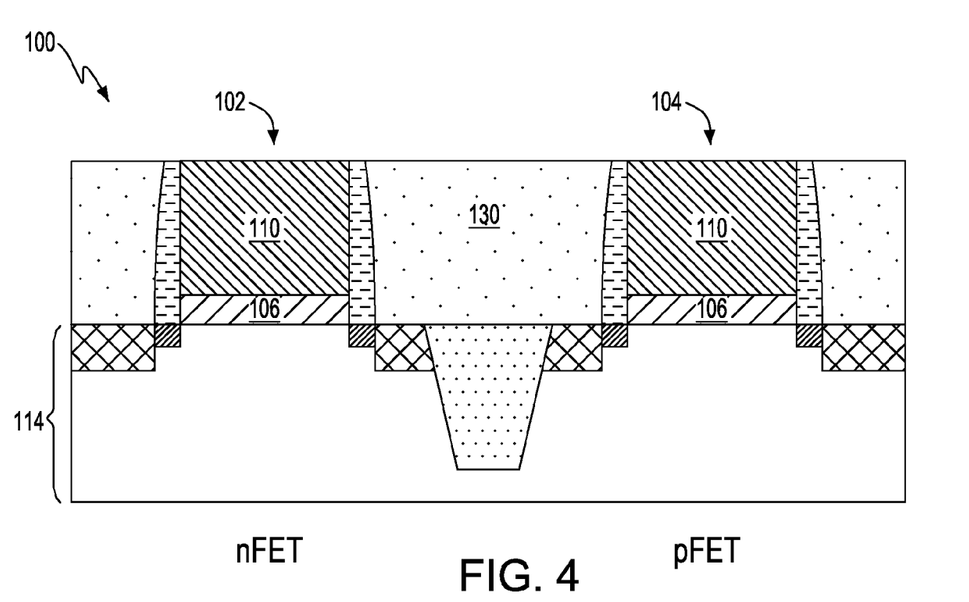
FIG. 4 illustrates planarizing to remove the hard nitride mask of the dummy gate structures.

The planarization process may continue to remove the nitride hard mask and expose the polysilicon 110 as shown in FIG. 4.

Figure 5:
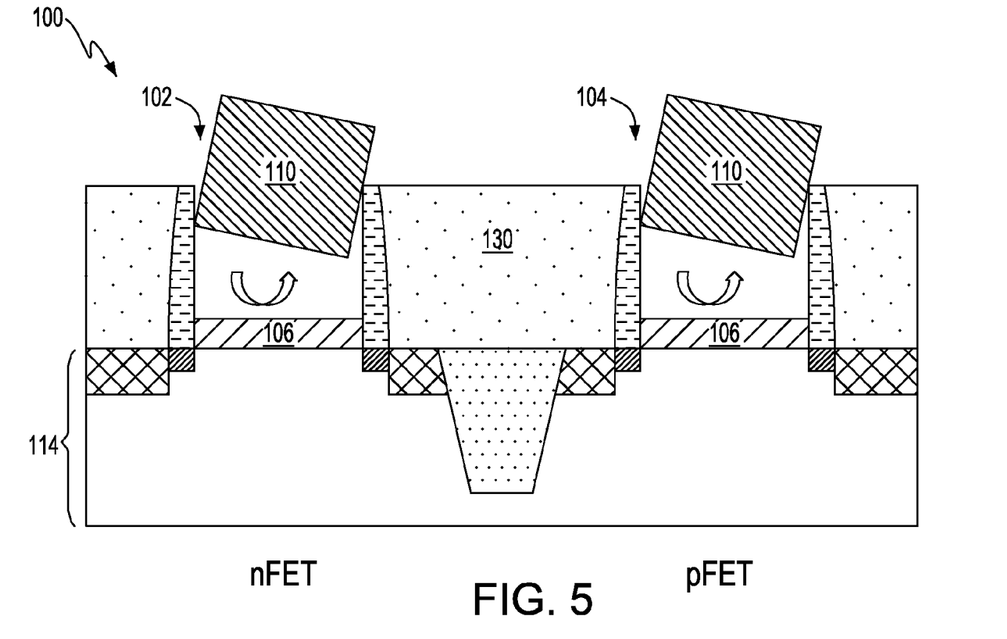
FIG. 5 illustrates removing the polysilicon (or amorphous silicon) of the dummy gate structures.

Referring now to FIG. 5, the polysilicon 110 may be removed from the gate structures 102, 104. The polysilicon 110 may be removed by a wet etching process such as tetramethylammonium hydroxide (TMAH), tetraethylammonium Hydroxide (TEAH) or ammonium hydroxide ($NH_4OH$). The polysilicon 110 may alternatively be removed by a combination of wet etching, using any of the foregoing etchants, and RIE.

Figure 6:
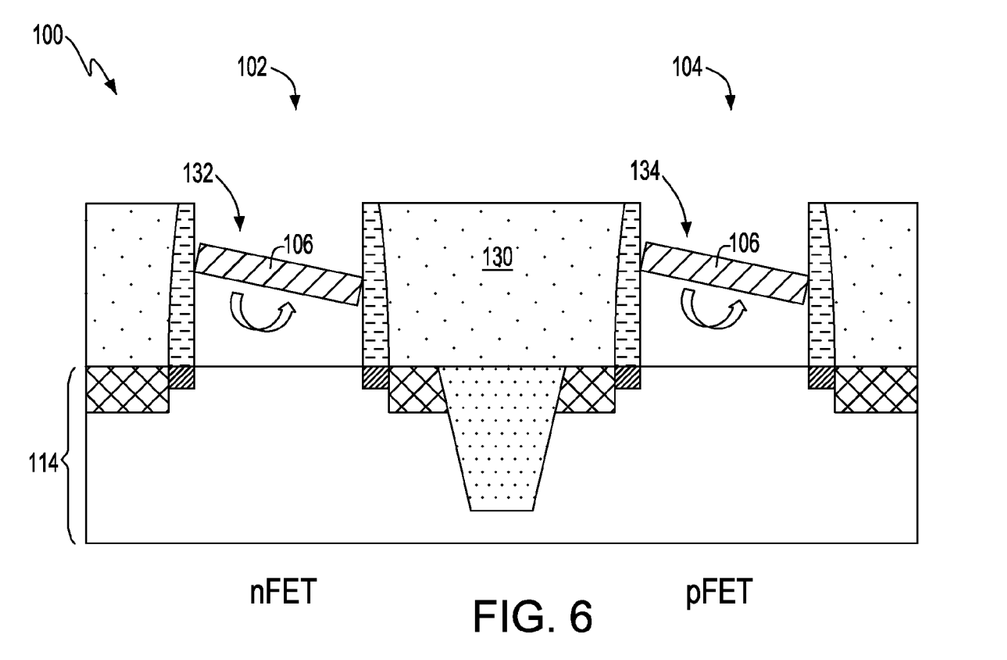
FIG. 6 illustrates removing the oxide of the dummy gate structures.

Subsequently, as shown in FIG. 6, the oxide layer 106 may be removed from the gate structures 102, 104 by a wet etching process including a suitable etchant such as hydrofluoric acid (HF). The recesses 132, 134 resulting from the removal of the oxide layer 106, polysilicon layer 110 and hard nitride mask layer 112 may be filled with work function and metal gate materials to result in permanent gate structures 102, 104 in the nFET portion and pFET portion of the semiconductor structure 100. Recesses 132, 134 may also be called trenches.

Figure 7:
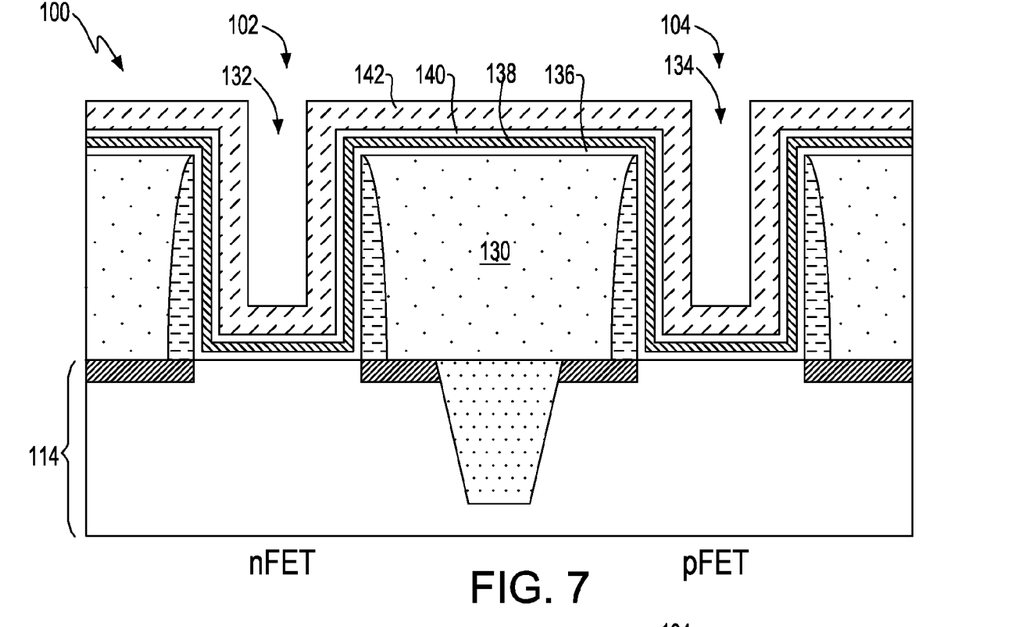
FIG. 7 illustrates sequentially depositing a gate dielectric, a first titanium nitride layer, a barrier layer and a second titanium nitride layer.

Referring now to FIG. 7, a gate dielectric 136 may be conformally deposited by an atomic layer deposition (ALD) process or a chemical vapor deposition (CVD) process. The gate dielectric 136 preferably is a high dielectric constant (high-k) dielectric material and may be, for example, $HfO_2$. The thickness of the gate dielectric may be about 2 nanometers (nm). Thereafter, sequential layers of a first titanium nitride 138, a barrier layer 140 such as tantalum nitride and a second titanium nitride 142 may be conformally deposited by an ALD process so that the deposited layers 138, 140, 142 line the walls of the recesses 132, 134. The first titanium nitride layer 138 may have a thickness of about 2 nm, the barrier layer 140 may have a thickness of about 1 nm and the second titanium nitride layer 142 may have a thickness of about 5 nm.

Figure 8:
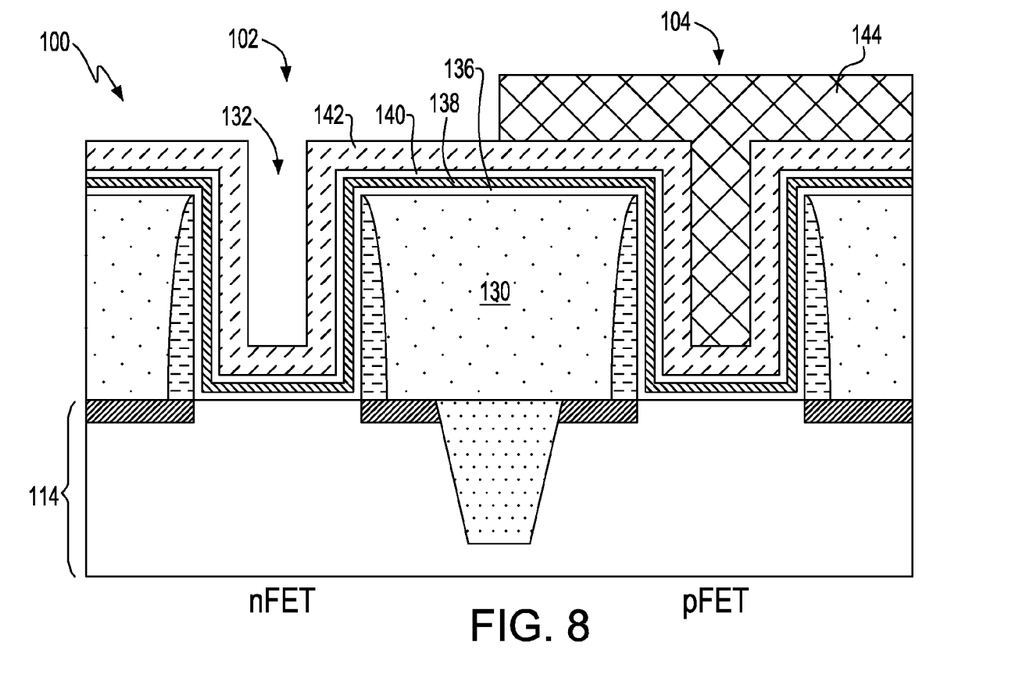
FIG. 8 illustrates defining a photoresist mask over the pFET portion.
Figure 9:
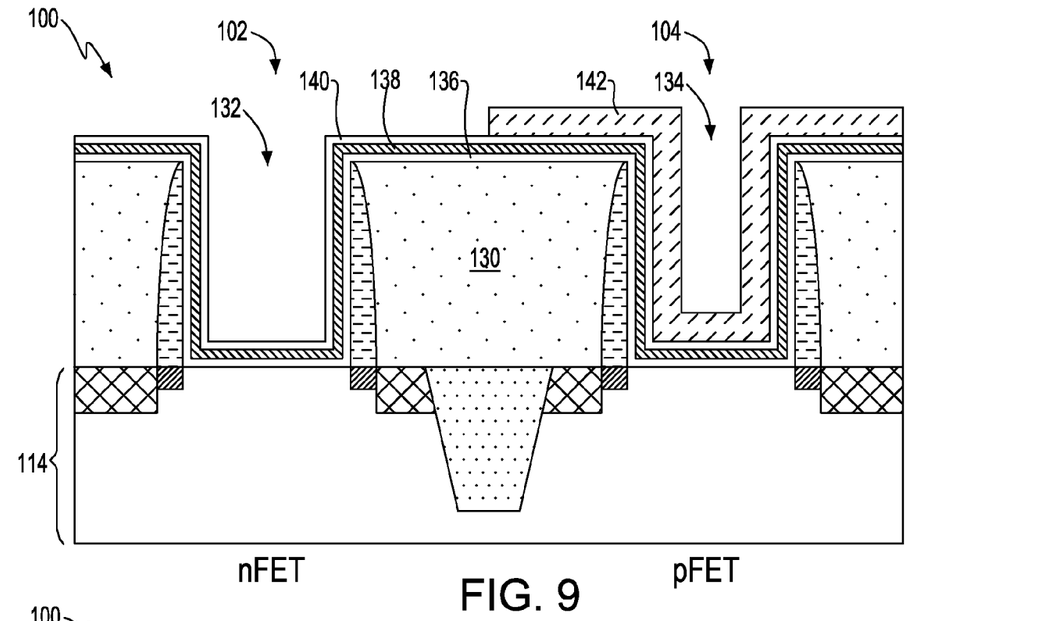
FIG. 9 illustrates removing the second titanium nitride layer from the nFET portion only.

The second titanium nitride layer 142 may serve as the work function metal for the pFET gate structure 104 so it may need to be removed from the nFET gate structure 102. Referring now to FIG. 8, the pFET gate structure 104 may be blocked off with a photoresist mask 144 that has been defined to cover the pFET portion and then the second titanium nitride layer 142 may be wet etched with, for example, a solution of hyrdrogen peroxide ($H_2O_2$), $NH_4OH$ and water or a solution of $H_2O_2$ and water. The resulting gate structure 102 without the second titanium nitride layer 142 is shown in FIG. 9. The photoresist mask 144 may then be conventionally stripped.

Figure 10:
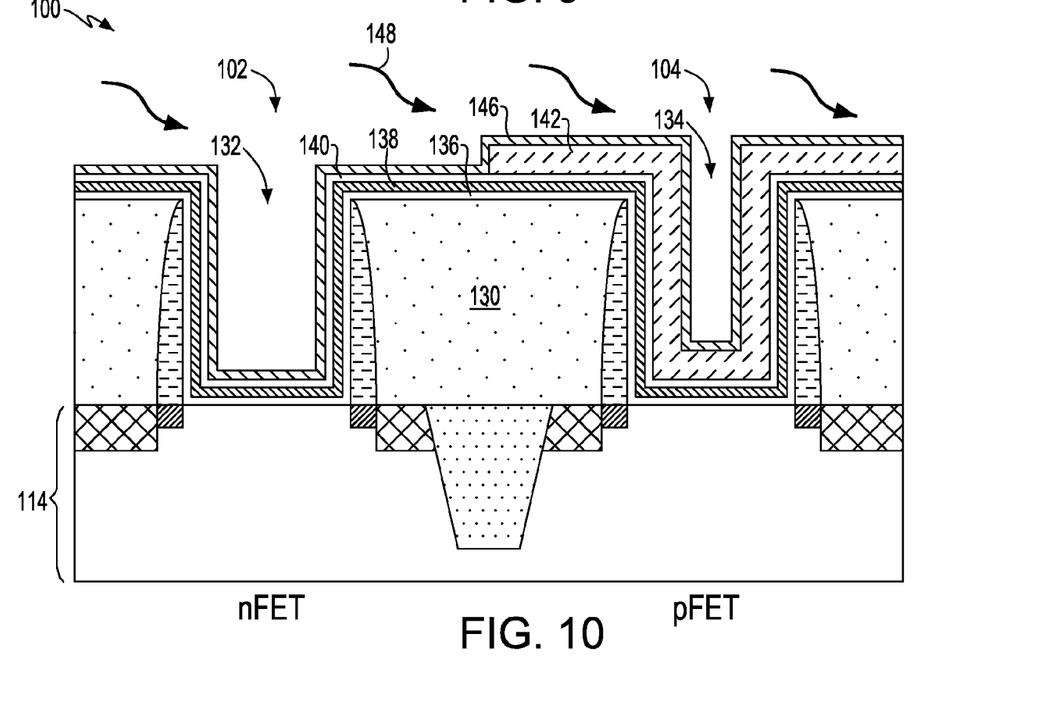
FIG. 10 illustrates depositing a third layer of titanium nitride on both the nFET and pFET portions.

Referring now to FIG. 10, a third titanium nitride layer 146 is deposited in both recesses 132, 134. The third titanium nitride layer 146 is in contact with the barrier layer 140 in the nFET gate structure 102 and in contact with the second titanium nitride layer 142 in the pFET gate structure 104. The third titanium nitride layer 146 may be conformally deposited by an ALD process. Thereafter, the third titanium nitride layer 146 may be subjected to a low temperature oxidation process, indicated by arrows 148, at 400° C. for 1 to 10 minutes in an oxidizing atmosphere. While not wishing to be held to any particular theory, it is believed that the low temperature oxidation renders the third titanium nitride layer 146 titanium-rich when combined with the oxygen gettering effect of titanium aluminum in the downstream process. Titanium-rich means that there is more than 50 atomic percent titanium.

Figure 11:
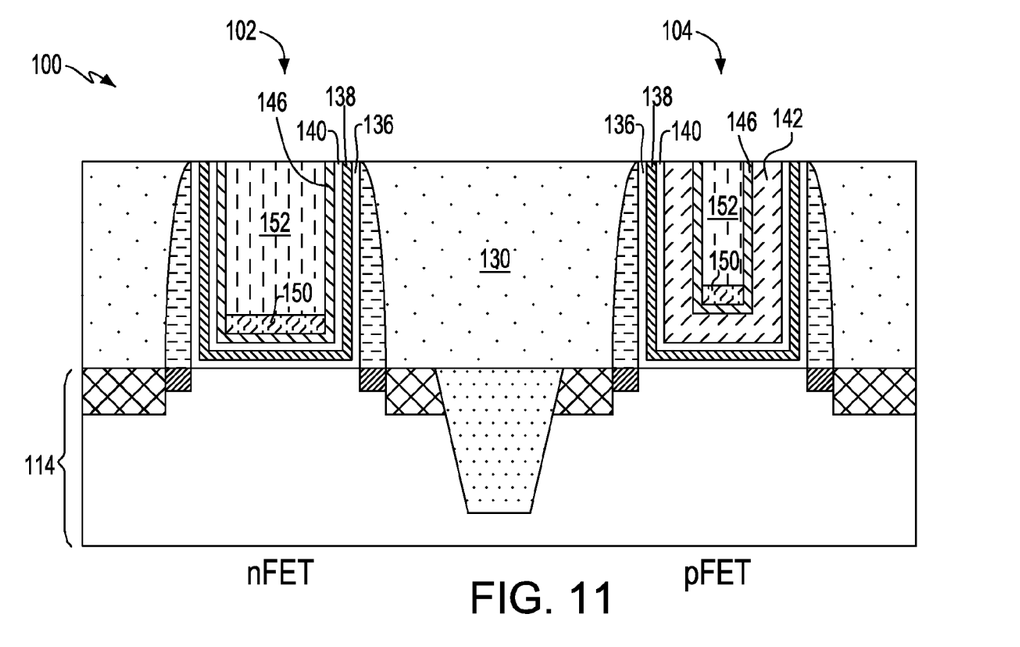
FIG. 11 illustrates depositing a titanium aluminum alloy and aluminum or tungsten on both the nFET and pFET portions.

Thereafter, now referring to FIG. 11, a titanium aluminum alloy 150 may be deposited in the recesses 132, 134 in direct contact with the titanium-rich titanium nitride 146 followed by a metal 152 such as aluminum or tungsten to fill the remainder of the recesses 132, 134. The semiconductor structure 100 may then be conventionally planarized to remove any overburden of the previously-deposited layers. The titanium aluminum alloy 150 may be deposited by physical vapor deposition (PVD) or atomic layer deposition (ALD) to a thickness of about 3 nm. The aluminum or tungsten 152 may be deposited by PVD (for aluminum) or CVD (for tungsten) to fill the remaining thickness of the recesses 132, 134.

The semiconductor structure 100 may undergo additional processing such as back end of the line processing to form finished semiconductor structures.

Figure 12:
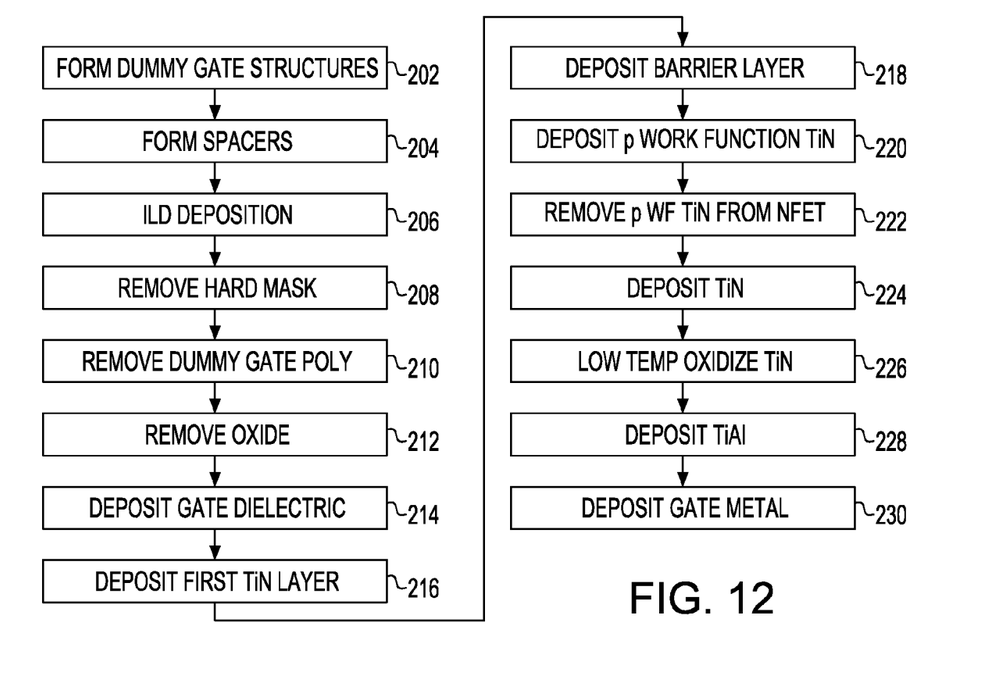
FIG. 12 is a flow chart illustrating the process flow of the exemplary embodiments.

A summary of the exemplary embodiments is illustrated in FIG. 12. In a first processing step, box 202, dummy gate structures are formed on nFET and pFET portions of a semiconductor substrate.

Thereafter, spacers may be formed on the dummy gate structures, box 204.

An ILD may be deposited between the dummy gate structures and then planarized, stopping on the dummy gate structures, box 206.

The hard nitride mask, gate polysilicon (or amorphous silicon) and oxide of the dummy gate structures may be removed, boxes 208, 210, 212, respectively, leaving recesses in the nFET and pFET portions.

A gate dielectric, preferably a high-k gate dielectric, may be deposited in the recesses in the nFET and pFET portions, box 214.

A first layer of titanium nitride is deposited in the recesses, box 216, followed by a barrier layer such as tantalum nitride, box 218.

A second layer of titanium nitride is deposited in the recesses, box 220. This second layer of titanium nitride is the work function metal for the pFET portion.

The second layer of titanium nitride is subsequently removed from the nFET portion, box 222.

A third layer of titanium nitride may then be deposited in the recesses, box 224. This layer of titanium nitride may be titanium-rich due to a low temperature oxidation, box 226.

Then, additional metals are deposited to fill the recesses including titanium aluminum and then aluminum or tungsten, boxes 228 and 230 respectively.

Other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of fabricating a replacement metal gate structure for a CMOS device on a semiconductor substrate comprising:

forming a dummy gate structure on an nFET portion of the CMOS device and on a pFET portion of the CMOS device, each of the dummy gate structures comprising a layer of oxide, a layer of polysilicon or amorphous silicon and a nitride hard mask;

forming spacers on the dummy gate structures;

depositing an interlayer dielectric between the dummy gate structures;

removing the dummy gate structures from the nFET portion and the pFET portion, resulting in a recess bounded by the spacers on the nFET portion and a recess bounded by the spacers on the pFET portion;

conformally depositing a gate dielectric into the recesses on the nFET portion and pFET portion;

depositing sequential layers of a first titanium nitride, tantalum nitride and a second titanium nitride into the recesses on the nFET portion and pFET portion;

removing the second layer of titanium nitride from the nFET portion only;

depositing a third layer of titanium nitride into the recesses on the nFET portion and pFET portion directly on and in direct physical contact with the layer of tantalum nitride in the nFET portion and directly on and in direct physical contact with the second titanium nitride in the pFET portion;

depositing titanium aluminum onto the third layer of titanium nitride in the recesses on the nFET portion and pFET portion; and filling the remainder of the cavity on the nFET portion and pFET portion with a metal different from titanium aluminum.

2. The method of claim 1 wherein after depositing the third layer of titanium nitride further comprising oxidizing the third layer of titanium nitride and wherein after depositing the titanium aluminum, the third layer of titanium nitride becomes titanium-rich such that the third layer of titanium nitride is greater than 50 atomic percent titanium.

3. The method of claim 2 wherein oxidizing the third layer of titanium nitride is at a temperature of 400° C. for 1 to 10 minutes.

4. The method of claim 1 wherein the metal different from titanium aluminum comprises aluminum or tungsten.

5. The method of claim 1 wherein the gate dielectric is a high dielectric constant gate dielectric.

6. The method of claim 5 wherein the gate dielectric is conformally deposited so as to cover a bottom and walls of the recesses.

7. The method of claim 1 wherein depositing sequential layers of a first titanium nitride, tantalum nitride and a second titanium nitride is by an atomic layer deposition (ALD) process.

8. The method of claim 7 wherein depositing the sequential layers of a first titanium nitride, tantalum nitride and a second titanium nitride is by a conformal deposition process.

9. A method of fabricating a replacement metal gate structure for a CMOS device on a semiconductor substrate comprising:

forming a dummy gate structure on an nFET portion of the CMOS device and on a pFET portion of the CMOS device;

depositing an interlayer dielectric between the dummy gate structures;

removing the dummy gate structures from the nFET portion and the pFET portion, resulting in a recess on the nFET portion and a recess on the pFET portion;

depositing a gate dielectric into the recesses on the nFET portion and pFET portion;

depositing sequential layers of a first titanium nitride, tantalum nitride and a second titanium nitride into the recesses on the nFET portion and pFET portion, the first layer of titanium nitride being in contact with the gate dielectric;

removing the second layer of titanium nitride from the nFET portion only;

depositing a third layer of titanium nitride into the recesses on the nFET portion and pFET portion, the third layer of titanium nitride being in direct physical contact with the tantalum nitride on the nFET portion and in direct physical contact with the second layer of titanium nitride on the pFET portion;

depositing titanium aluminum onto the third layer of titanium nitride in the recesses on the nFET portion and pFET portion; and filling the remainder of the cavity on the nFET portion and pFET portion with a metal.

10. The method of claim 9 wherein after depositing the third layer of titanium nitride further comprising oxidizing the third layer of titanium nitride and wherein after depositing the titanium aluminum, the third layer of titanium nitride becomes titanium-rich such that the third layer of titanium nitride is greater than 50 atomic percent titanium.

11. The method of claim 10 wherein oxidizing the third layer of titanium nitride is at a temperature of 400° C. for 1 to 10 minutes.

12. The method of claim 9 wherein the metal comprises a first layer of titanium aluminum and a second layer of aluminum or tungsten.

13. The method of claim 9 wherein the gate dielectric is a high dielectric constant gate dielectric.

14. The method of claim 13 wherein the gate dielectric is conformally deposited so as to cover a bottom and walls of the recesses.

15. The method of claim 9 wherein depositing sequential layers of a first titanium nitride, tantalum nitride and a second titanium nitride is by an atomic layer deposition (ALD) process.

16. The method of claim 9 wherein depositing the sequential layers of a first titanium nitride, tantalum nitride and a second titanium nitride is by a conformal deposition process.

* * * * *